United States Patent [19]
Hiyoshi et al.

[11] Patent Number: 5,360,985
[45] Date of Patent: Nov. 1, 1994

[54] PRESS-CONTACT TYPE SEMICONDUCTOR DEVICE

[75] Inventors: Michiaki Hiyoshi; Takashi Fujiwara; Hisashi Suzuki; Hideo Matsuda, all of Yokohama, Japan

[73] Assignee: Kabushiki Kaisha Toshiba, Kawasaki, Japan

[21] Appl. No.: 70,040

[22] Filed: Jun. 1, 1993

Related U.S. Application Data

[63] Continuation of Ser. No. 762,460, Sep. 19, 1991, abandoned.

[30] Foreign Application Priority Data

Sep. 20, 1990 [JP] Japan .................. 2-251549
Sep. 6, 1991 [JP] Japan .................. 3-227109

[51] Int. Cl.⁵ .................................. H01L 23/02
[52] U.S. Cl. .......................... 257/181; 257/688; 257/773
[58] Field of Search ............... 357/74, 79; 257/181, 257/773, 688

[56] References Cited

U.S. PATENT DOCUMENTS

| | | | |
|---|---|---|---|
| 3,893,153 | 7/1975 | Page et al. | 257/773 |
| 4,881,118 | 11/1989 | Niwayama et al. | 257/181 |
| 4,918,514 | 4/1990 | Matsuda et al. | 357/79 |
| 4,937,653 | 6/1990 | Blonder et al. | 357/79 |
| 4,958,215 | 9/1990 | Kojima et al. | 357/79 |
| 4,996,586 | 2/1991 | Matsuda et al. | 357/79 |

FOREIGN PATENT DOCUMENTS

| | | |
|---|---|---|
| 0021025 | 1/1981 | European Pat. Off. . |
| 0347561 | 12/1989 | European Pat. Off. . |
| 0365007 | 4/1990 | European Pat. Off. . |
| 2556469 | 6/1977 | Germany . |

OTHER PUBLICATIONS

Patent Abstracts of Japan, vol. 4, No. 126(E-024), Sep. 5, 1980, & JP-A-55-078535, Jun. 13, 1980, M. Odate, "Pressure-Contact Type Semiconductor Device".
Patent Abstracts of Japan, vol. 3, No. 117(E-141), Sep. 29, 1979, & JP-A-54-095183, Jul. 27, 1979, M. Odate, "Pressure Contact-Type Semiconductor Device".
*Research Disclosure*, Mar. 1988, p. 155, "Method to Provide Multiple Dendritic Contact Points for High Density Flat on Flat Connector System".

Primary Examiner—William Mintel
Assistant Examiner—Roy Potter
Attorney, Agent, or Firm—Oblon, Spivak, McClelland, Maier & Neustadt

[57] ABSTRACT

In a semiconductor device, a pellet electrode, which is formed on a mesa-shaped pellet, and an external electrode, with which a package is provided, are in pressure-contact with each other. A soft-metal plate which has projections along its surface is arranged between the external electrode and the pellet electrode.

14 Claims, 6 Drawing Sheets

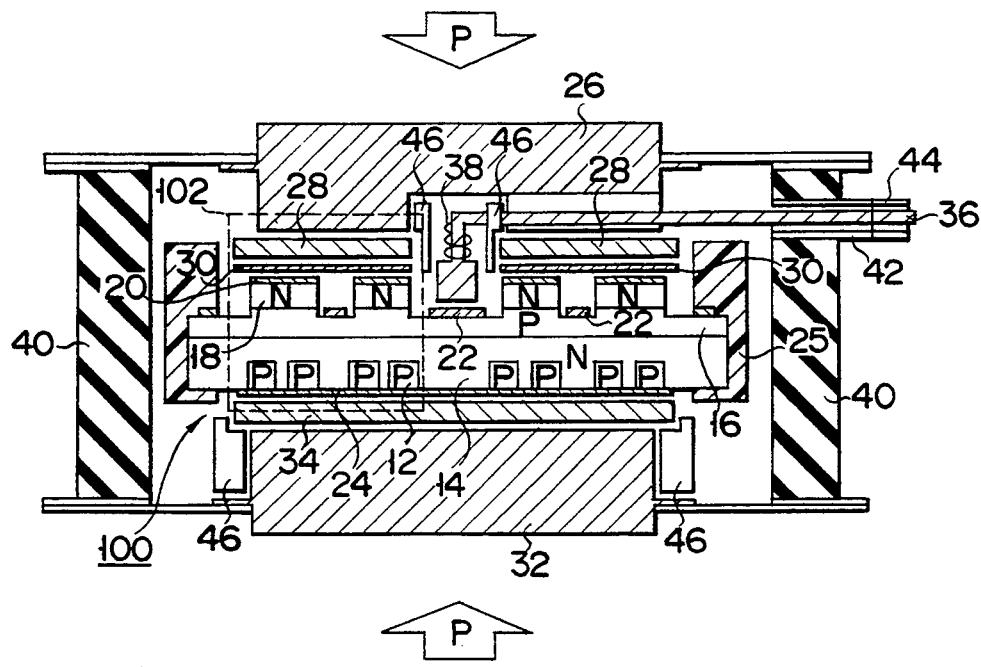
F I G. 1
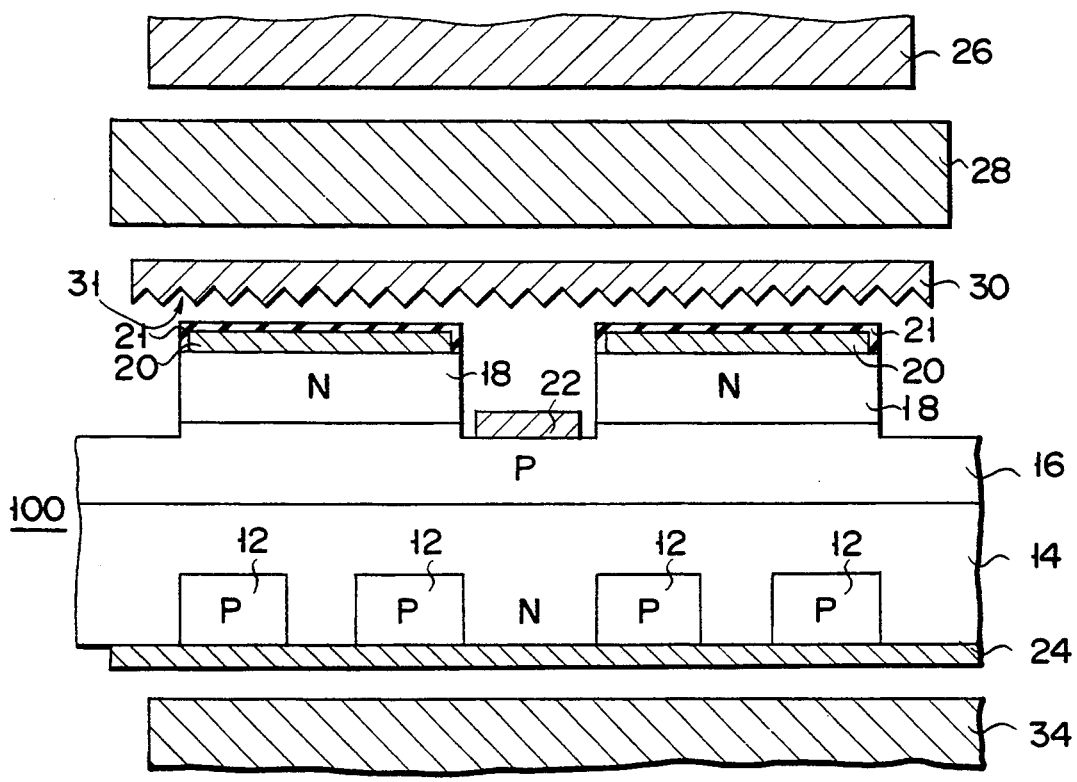
F I G. 2

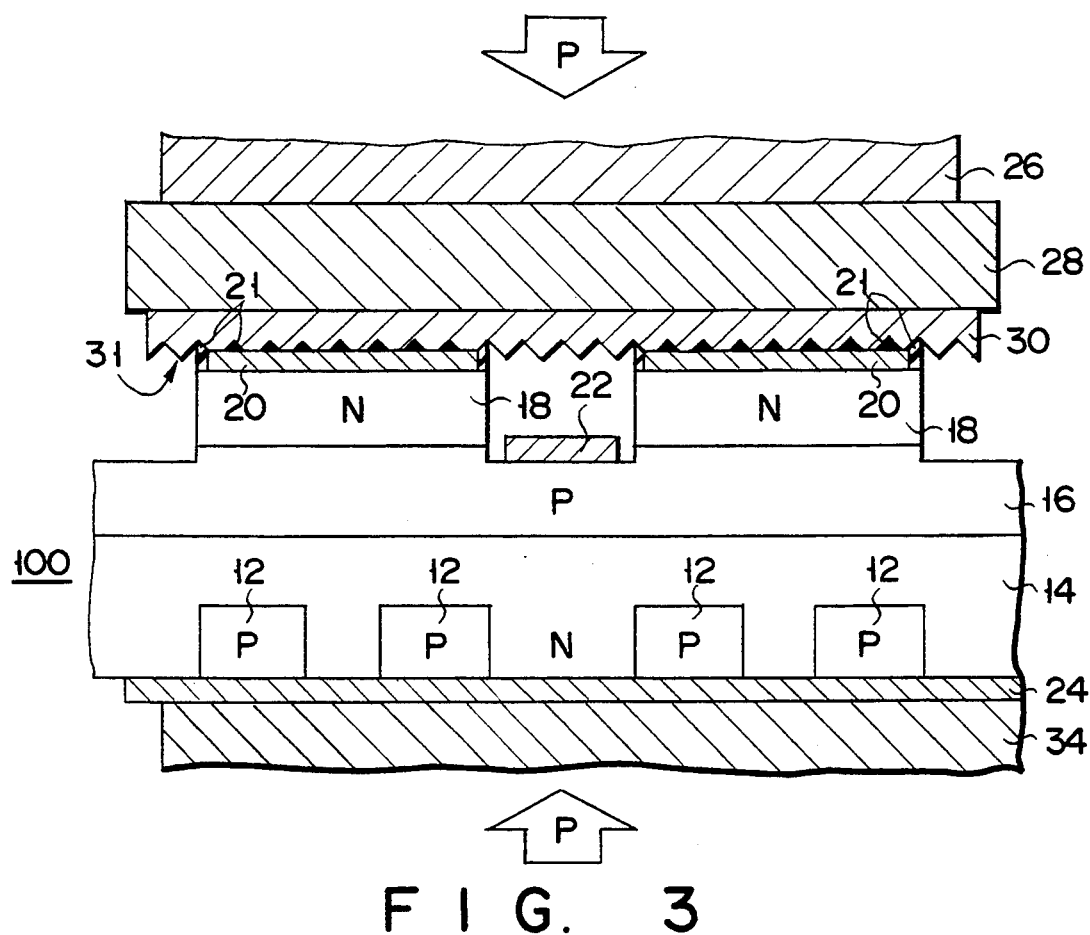
F I G. 3
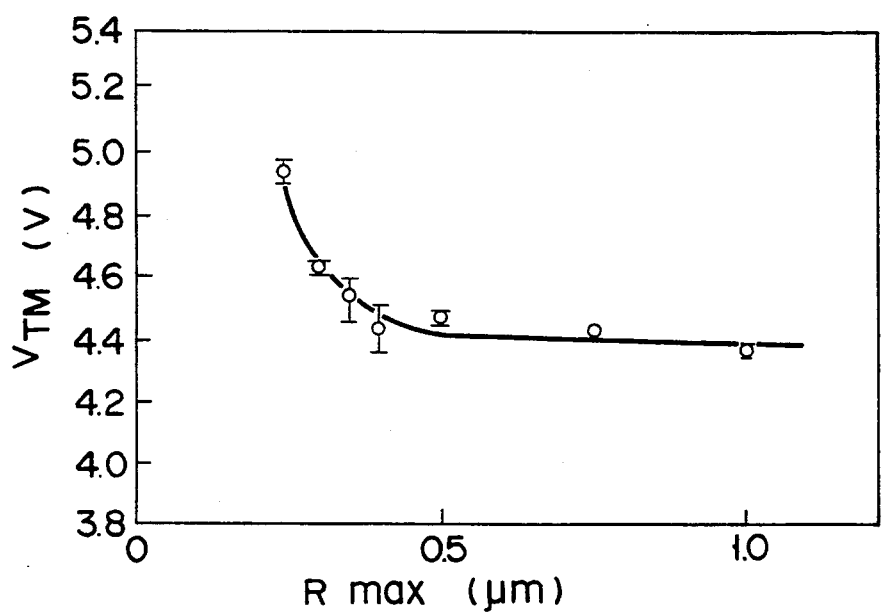
F I G. 4

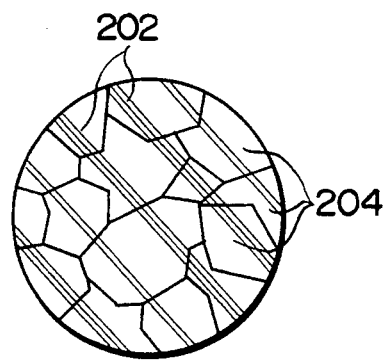
F I G. 9A
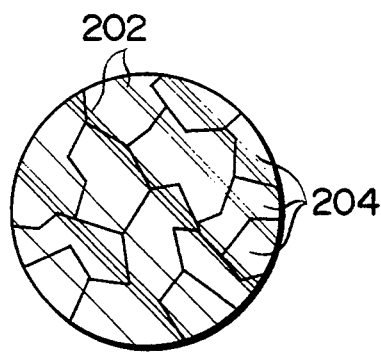
F I G. 11A
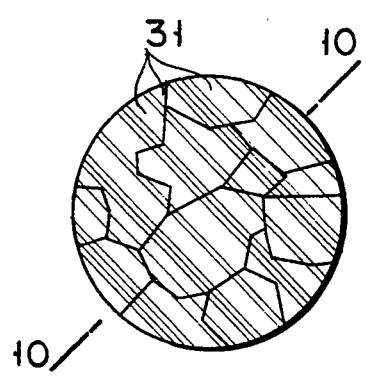
F I G. 9B
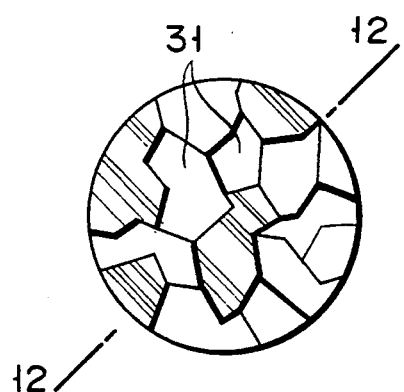
F I G. 11B
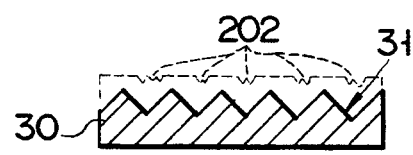
F I G. 10
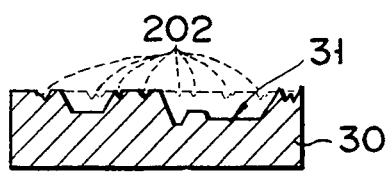
F I G. 12

PRESS-CONTACT TYPE SEMICONDUCTOR DEVICE

This application is a continuation of U.S. application Ser. No. 07/762,460, filed on Sep. 19, 1991, now abandoned.

BACKGROUND OF THE INVENTION

1. Field of the Invention

This invention relates to a press-contact type semiconductor device and, more particularly, to a press-contact type semiconductor device with a low ON voltage for turning on the elements incorporated therein.

2. Description of the Related Art

In an ordinary press-contact type semiconductor device, an electrode which is formed on the semiconductor pellet (this electrode is hereinafter referred to as the pellet electrode), and an electrode with which the device package is provided (this electrode is hereinafter referred to as the external electrode), are brought into pressure-contact with each other so as to achieve electrical connection therebetween. The contacts of the pellet electrode and the external electrode can resist a high voltage, and consequently the above semiconductor device is commonly used as a semiconductor device to which a large current is supplied.

In general, in a press-contact type semiconductor device to which a large current is supplied, a stress decreasing member (hereinafter referred to as the soft-metal plate) constituted by a relatively soft metal (e.g. copper) sheet is inserted between the pellet electrode and the external electrode in order to prevent the pellet from cracking due to stress resulting from generation of heat.

However, such a semiconductor device has the drawback that the resistance between the pellet electrode and the external electrode is high due to the insulating film covering the pellet electrode, resulting in a high ON voltage for turning on the elements incorporated in the semiconductor device.

SUMMARY OF THE INVENTION

It is therefore the object of the present invention to provide a press-contact type semiconductor device with a low ON voltage for turning on the elements incorporated therein.

According to the present invention, in order to achieve the above object, a rough soft-metal plate is inserted between the pellet electrode and the external electrode. To use such a metal plate in a press-contact type semiconductor device results in a low ON voltage, for the reason stated below.

The pellet electrode has an insulating film formed thereover such as an oxide film. As the pellet electrode and the external electrode are brought into pressure-contact with each other, with a soft-metal plate which has projections along its surface being arranged therebetween, those projections penetrate through the insulating film of the pellet electrode such that the soft-metal plate directly contacts the pellet electrode. Under this condition, the contact resistance is low and the resistance between the external electrode and the pellet electrode is correspondingly low, ensuring a low ON voltage of the semiconductor device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross-sectional view of the press-contact type semiconductor device according to a first embodiment of the present invention;

FIG. 2 is an enlarged view of a part 102 of the semiconductor device which is indicated with a broken line in FIG. 1;

FIG. 3 is a diagram showing the state of the semiconductor device of the first embodiment when pressure P is applied thereto;

FIG. 4 is a graph showing the relationship between the projections of the soft-metal plate and the ON voltage of a thyristor;

FIG. 9A is an enlarged view of a surface of the soft-metal plate before being subjected to etching using a hydrochloric acid etchant;

FIG. 9B is an enlarged view of a surface of the soft-metal plate after being subjected to etching using a hydrochloric acid etchant;

FIG. 10 is the cross section of the soft-metal plate which is taken along the line 10—10 shown in FIG. 9B;

FIG. 11A is an enlarged view of a surface of the soft-metal plate before being subjected to etching using a phosphoric acid series etchant;

FIG. 11B is an enlarged view of a surface of the soft-metal plate after being subjected to etching using a phosphoric acid series etchant; and FIG. 12 is the cross section of the soft-metal plate which is taken along the line 12—12 shown in FIG. 11B.

DETAILED DESCRIPTION OF THE PREFERRED EMBODIMENTS

Figure 5:
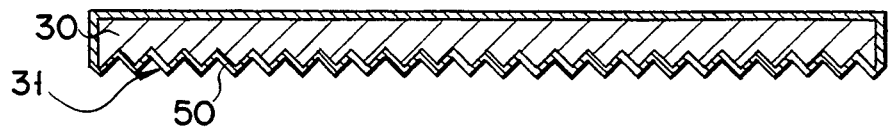
FIG. 5 is a cross-sectional view of a modified soft-metal plate.

The pressure-contact type semiconductor devices according to the first to third embodiments of the present invention will now be described with reference to the drawings, throughout which like reference numerals designate like or corresponding elements. The elements explained in the description of the first embodiment will not be repeated in detail in the descriptions of the second and third embodiments.

FIG. 1 is a cross-sectional view of the press-contact type semiconductor device (anode short-circuiting type GTO thyristor) according to the first embodiment of the present invention.

As can be seen in FIG. 1, a semiconductor pellet 100 includes a P-type emitter layer 12, an N-type base layer 14, a P-type base layer 16, and an N-type emitter layer 18, which is formed in a mesa shape on the P-type base layer 16. A cathode electrode 20 which is made of aluminum is formed on the N-type emitter layer 18. A gate electrode 22 which is also made of aluminum is formed on the P-type base layer 16. The P-type emitter layer 12 is formed in a surface of the N-type base layer 14. An anode electrode 24, also made of aluminum, is formed so as to extend over the P-type emitter layer 12 and the N-type base layer 14, constituting what is called an "anode short-circuiting type GTO thyristor". The side surfaces of the pellet 100 are covered by a passivation film 25 which is made of silicone resin, for example. The pellet 100 may be beveled to attain a satisfactory high anode-cathode withstand voltage (such a beveled pellet is not shown in the drawings). A cathode electrode post (external electrode) 26, to which pressure P is being applied, is in pressure-contact with the cathode electrode 20, with an electrode plate 28 and a soft-metal plate 30, which is made of copper, arranged therebetween. An anode electrode post (external electrode) 32, to which pressure P is being applied, is in pressure-contact with the anode electrode 24, with an electrode plate 34 arranged therebetween. A gate lead 36 is in contact with the gate electrode 22 under the pressure applied by a gate pressing spring 38. One end of the gate lead 36 extends outside an insulating cylindrical casing (package) 40 through a metal sleeve 42 brazed to the side wall thereof. The sleeve 42 has a sealing portion 44, which is plugged such that the pellet 100 is sealed within the package 40.

The electrode plates 28 and 34, which are made of e.g. molybdenum and positioned by positioning members 46, are located the former between the cathode electrode post 26 and the cathode electrode 20 and the latter between the anode electrode post 32 and the anode electrode 24.

FIG. 2 is an enlarged view of a part 102 which is represented by a broken line in FIG. 1.

As is shown in FIG. 2, the soft-metal plate 30 has projections 31 along its surface. The cathode electrode 20 which is made of aluminum is covered by an insulating film 21 made of alumina ($AlO_3$). Each of the anode electrode 24 and the gate electrode 22 is also covered by an insulating film made of alumina (the insulating films covering them are not shown in the drawings).

FIG. 3 is a diagram showing the state of the aforementioned thyristor when pressure p is applied thereto.

In the thyristor shown in FIG. 3, the soft-metal plate 30 and the cathode electrode 20 are in direct contact with each other by means of the projections 31 penetrating through the insulating film 21. Under this condition, the resistance between the soft-metal plate 30 and the cathode electrode 20 is low, ensuring a low ON voltage of the thyristor.

The entire surface region of the soft-metal plate 30 may have the projections 31 or, as shown in FIGS. 2 and 3, only that surface region of the soft-metal plate 30 which faces the cathode electrode 20 may have the same.

In the first embodiment, the soft-metal plate 30 which is made of copper is subjected to etching using acid (HCl) in order to provide it with the projections 31.

To determine the relationship between the surface roughness of the soft-metal plate 30 and the ON voltage of the thyristor, the inventors made packages which had the structure identical to that one shown in FIG. 1, and which were identical to one another, except that they have soft-metal plates having different surface roughnesses. These packages were tested, supplying a current $I_{TM}$ of 3000A, and maintaining the packages at temperature of 25° C., thereby detecting their ON voltages. The results of the test were as is shown in FIG. 4, wherein the ON voltages are plotted on the ordinate, and the maximum height Rmax" of the projections 31 are plotted on the abscissa. (Rmax is the height between the zenith and the nadir within a given portion, having a reference length L (=0.25 mm in this case), or a cross section of the plate 30. It should be noted that the projections 31 were formed by etching the plate 30 with HCl.

As a result of this test, it was found that the higher the projections 31, the lower the ON voltage $V_{TM}$, and that the ON voltage $V_{TM}$ is particularly low when the maximum height Rmax is 0.5 $\mu$m or greater (in place of the maximum height Rmax, a ten-point mean roughness Rz, a mean roughness Ra, or the like may be used to represent the surface roughness of the soft-metal plate 30).

For the definitions of Rmax, Rz, and Ra, see Japanese Industrial Standards (JIS), B 0601, 1976.

In the event that the soft-metal plate 30 has scratches of depths equal to or greater than 0.5 $\mu$m, the soft-metal plate 30 can be regarded as having a maximum height Rmax of 0.5 $\mu$m. However, a low ON voltage cannot be realized only with such scratches. By virtue of the projections 31 over that surface region of the plate 30 which faces the cathode electrode 20, a low ON voltage can be attained.

FIG. 5 shows in cross section an example of a modification of the soft-metal plate 30 used in the first embodiment.

As is shown in FIG. 5, the soft-metal plate 30 having the projections 31 may be covered by a coating film 50 which is made of gold (Au), for example.

The soft-metal plate 30 covered by the coating film 50 can be obtained by subjecting the soft-metal plate 30, made of copper, to etching, using acid in order to provide the plate 30 with the projections 31, and by thereafter plating it with gold for example. By forming the coating film 50 which is made of a conductive and inactive material such as gold on the copper plate 30, the plate 30 can be successfully protected from oxygen contained in the atmosphere, thus preventing the plate 30 from oxidizing.

Figure 6:
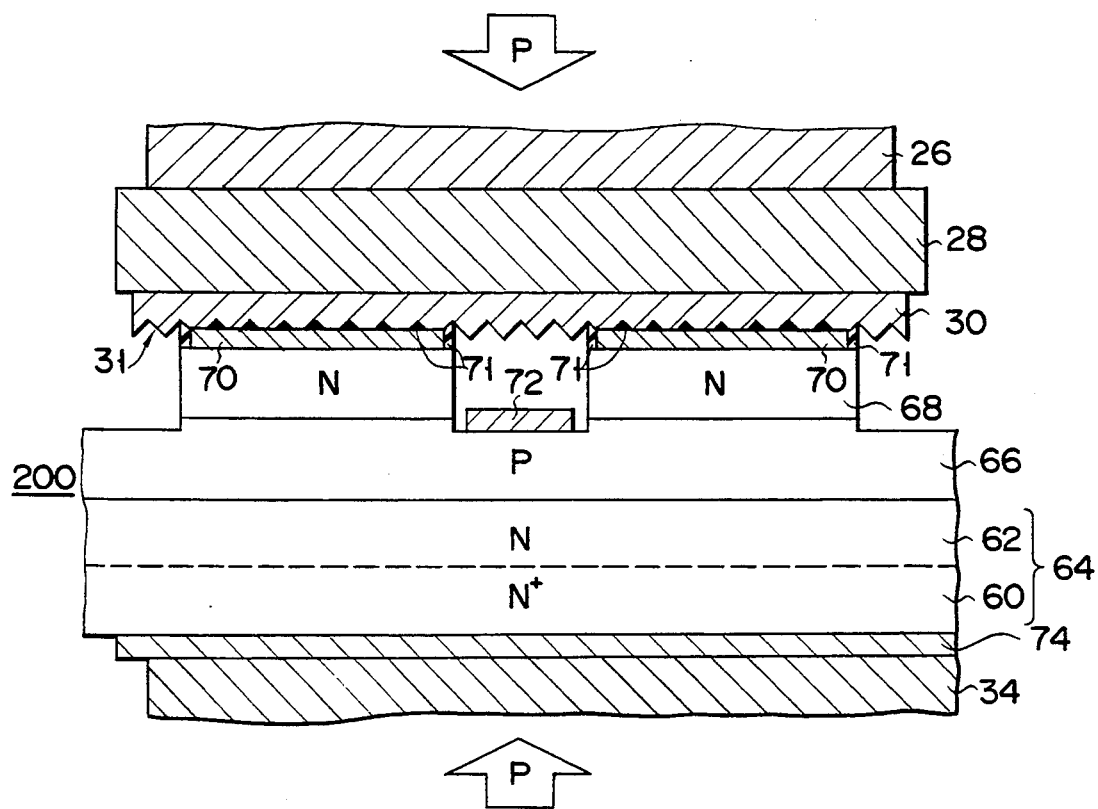
FIG. 6 is a cross-sectional view of the press-contact type semiconductor device according to a second embodiment of the present invention.

FIG. 6 is a cross-sectional view of the press-contact type semiconductor device according to the second embodiment of the present invention.

In the second embodiment, as can be seen in FIG. 6, a pellet 200, in which a power transistor is formed, is employed in place of the pellet 100 in which a GTO thyristor is formed. The pellet 200 includes an N-type collector layer 64 consisting of an N+-type silicon layer 60 and an N-type silicon layer 62, a P-type base layer 66 which is formed on the N-type collector layer 64, and an N-type emitter layer 68 which is formed in a mesa shape on the P-type base layer 66. An emitter electrode 70 which is made of aluminum is formed on the N-type emitter layer 68, a base electrode 72 which is also made of aluminum is formed on the P-type base layer 66, and a collector electrode 74 which is also made of aluminum is formed on the N-type collector layer 64. Each of these electrodes 70, 72, and 74 is covered by an insulating film made of aluminum. In FIG. 6, only the insulating film covering the emitter electrode 70 is shown with a reference numeral 71.

In the second embodiment, as in the first embodiment, a low ON voltage can be attained by employing the soft-metal plate 30 having projections 31.

Figure 7:
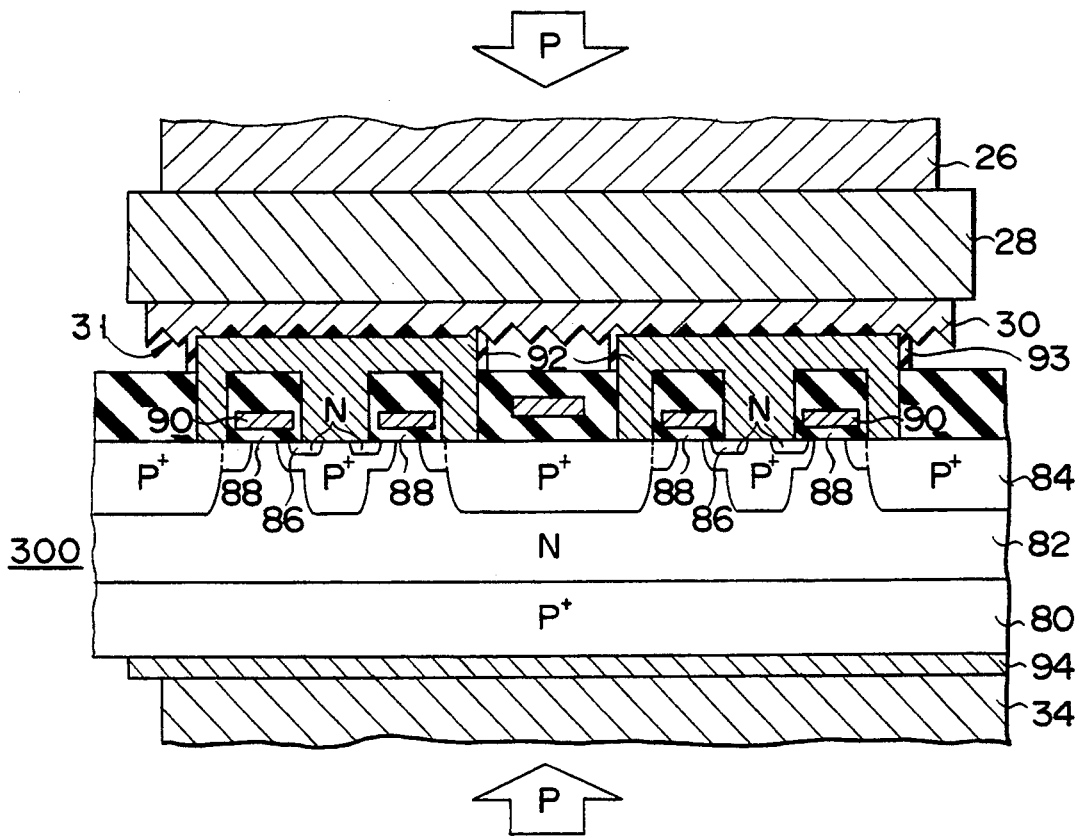
FIG. 7 is a cross-sectional view of the press-contact type semiconductor device according to a third embodiment of the present invention.

FIG. 7 is a cross-sectional view of the press-contact semiconductor device according to the third embodiment of the present invention.

In the third embodiment, a pellet 300, in which an IGBT is formed, is employed as shown in FIG. 7. The pellet 300 includes a P+-type anode layer 80, an N-type collector layer 82 which is formed on the P+-type anode layer 80, a P-type base layer 84 which is formed in the N-type collector layer 82, and an N-type source layer 86 which is formed in the P+-type base layer 84. A gate electrode 90 is formed above the P-type base layer 84 located between the N-type collector layer 82 and the N-type source layer 86, with a gate insulating film 88 present under the gate electrode 90. An insulating film 91 is formed so as to cover the gate electrode 90. A cathode electrode 92 made of aluminum is formed on the P-type base layer 84 and the N-type source layer 86. An anode electrode 94 which is made of aluminum is formed on the P+-type anode layer 80. Each of these electrodes 92 and 94 is covered by an insulating film made of alumina. In FIG. 7, only the insulating film covering the electrode 92 is shown with reference numeral 93.

In the third embodiment, as well as in the first embodiment, a low ON voltage can be attained by employing the soft-metal plate 30 having projections 31.

A method for producing the soft-metal plate 30 will now be described.

FIGS. 8A to 8D are diagrams which show progressive steps in producing the soft-metal plate 30.

Figure 8A:
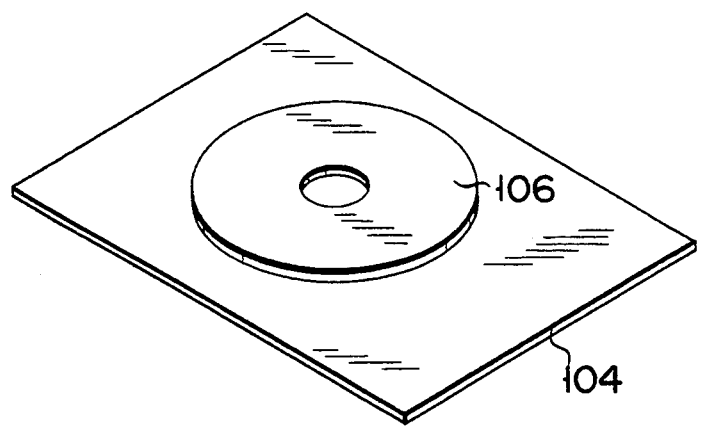
FIGS. 8A to 8D are diagrams which show progressive steps in producing a soft-metal plate 30.
Figure 8B:
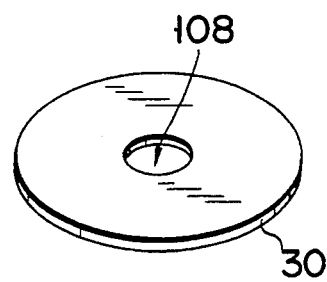

Firstly, a photoresist film 106 is formed on a copper plate 104 by a photo-etching method, as is shown in FIG. 8A, after which the copper plate 104 is subjected to patterning, with the photoresist film 106 used as a mask, thereby obtaining a disk-shaped soft-metal plate 30 having an opening 108 formed in its central portion, as shown in FIG. 8B. The opening 108 is one into which the gate lead shown in FIG. 1 is inserted.

Figure 8C:
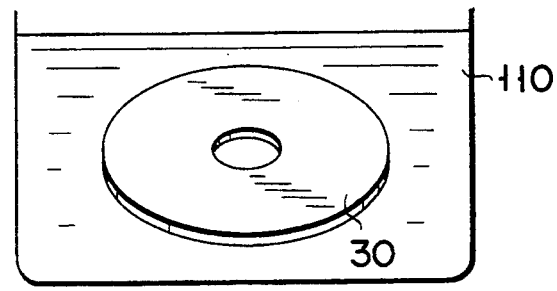

Then, as is shown in FIG. 8C, the soft-metal plate 30 is immersed in an etchant 110 of hydrochloric acid for 20 minutes, and 70° C.–90° C. (the plate 30 may be immersed for 15 minutes in an etchant of phosphoric acid series, e.g. phosphoric acid plus $H_2O_2$ plus $H_2O$), after which it is subjected to etching, with the result that the soft-metal plate 3 having projections 31 is obtained, as is shown in FIG. 8D.

Figure 8D:
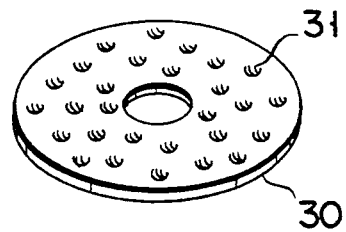

If the soft-metal plate 30 is plated with gold after the step shown in FIG. 8D, the soft-metal plate 30 shown in FIG. 5 which is covered by the coating film 50 can be obtained.

FIG. 9A is an enlarged view of a surface of the soft-metal plate 30 before being subjected to etching using the etchant (hydrochloric acid) 110, and FIG. 9B is an enlarged view of a surface of the soft-metal plate 30 after being subjected thereto. FIG. 10 is the cross-section of the soft-metal plate 30 which is taken along the line 10—10 shown in FIG. 9B.

FIG. 11A is an enlarged view of a surface of the soft-metal plate 30 before being subjected to the etchant 110 (phosphoric acid series), and FIG. 11B is an enlarged view of a surface of the soft-metal plate 30 after being subjected thereto. FIG. 12 is the cross section of the soft-metal plate 30 which is taken along the line 12—12 shown in FIG. 11B.

When the soft-metal plate 30 is subjected to etching using a hydrochloric acid etchant, as is shown in FIGS. 9A–9B and 10, projections 31 are formed in accordance with scratches 202 which are formed mainly by a reduction roll.

When the soft-metal plate 30 is subjected to etching using a phosphoric acid series etchant, as is shown in FIG. 11A–11B and 12, projections 31 are formed in accordance with crystal grains 204. Thus, in the case of etching using a phosphoric acid series etchant, the shape of the projections 31 depends upon crystal orientation.

As can be understood from the above, the projections 31 can be formed using each of a hydrochloric acid etchant and a phosphoric acid series etchant. However, in consideration of environmental pollution, it is preferable to use a phosphoric acid series etchant. In addition, copper is suitable for use as the material of the soft-metal plate 30, since copper is low in price and therefore best when producing a large number of soft-metal plates.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A press-contact type semiconductor device comprising:
    a pellet having first and second major surfaces, said pellet having a mesa portion provided on said first major surface, said second major surface being flat;
    a package enclosing said pellet;
    a first pellet electrode provided on said mesa portion of said pellet;
    a second pellet electrode provided on said second major surface of said pellet;
    a semiconductor element provided in said pellet and having a current path, said first pellet electrode being connected to one end of said current path, said second pellet electrode being connected to another end of said current path;
    a first electrode post which is provided in said package so as to be located above said first pellet electrode, and to which pressure is applied;
    a second electrode post which is provided in said package so as to be located above said second pellet electrode, and to which pressure is applied;
    an electrode plate arranged between said first pellet electrode and said first electrode post;
    a soft-metal plate arranged between said first pellet electrode and said electrode plate, and having a ragged surface; and
    a protecting layer provided on said ragged surface of said soft-metal plate, for protecting said ragged surface from oxidization.

2. The press-contact type semiconductor device according to claim 1, wherein said soft-metal plate has projections provided on said ragged surface and having a maximum height of 0.5 μm to 1.0 μm when a reference length is 0.25 mm.

3. The press-contact type semiconductor device according to claim 1, wherein said soft-metal plate is made of copper.

4. The press-contact type semiconductor device according to claim 1, wherein said first pellet electrode on said mesa portion is made of aluminum.

5. The press-contact type semiconductor device according to claim 1, wherein said semiconductor element comprises a thyristor.

6. The press-contact type semiconductor device according to claim 1, wherein said semiconductor element comprises a bipolar transistor.

7. The press-contact type semiconductor device according to claim 1, wherein said semiconductor element comprises an insulated-gate bipolar transistor.

8. The press-contact type semiconductor device according to claim 1, further comprising:
   a further electrode plate arranged between said second pellet electrode and said second electrode post.

9. The press-contact type semiconductor device according to claim 8, wherein said soft-metal plate has projections provided on said ragged surface and having a maximum height of 0.5 $\mu$m to 1.0 $\mu$m when a reference length is 0.25 mm.

10. The press-contact type semiconductor device according to claim 8, wherein said soft-metal plate is made of copper.

11. The press-contact type semiconductor device according to claim 8, wherein said first pellet electrode on said mesa portion is made of aluminum.

12. The press-contact type semiconductor device according to claim 8, wherein said electrode plate is made of molybdenum, and said further electrode plate is made of molybdenum.

13. The press-contact type semiconductor device according to claim 1, wherein said protecting layer is made of gold.

14. The press-contact type semiconductor device according to claim 1, wherein said electrode plate is made of molybdenum.

* * * * *